United States Patent
Goyal et al.

(10) Patent No.: US 7,831,876 B2
(45) Date of Patent: Nov. 9, 2010

(54) TESTING A CIRCUIT WITH COMPRESSED SCAN CHAIN SUBSETS

(75) Inventors: Saket K. Goyal, San Jose, CA (US); Thai Minh Nguyen, San Jose, CA (US); Arun K. Gunda, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 366 days.

(21) Appl. No.: 11/877,360

(22) Filed: Oct. 23, 2007

(65) Prior Publication Data

US 2009/0106613 A1  Apr. 23, 2009

(51) Int. Cl.
*G01R 31/28* (2006.01)

(52) U.S. Cl. .................... 714/729; 714/25; 714/30; 714/726; 714/727

(58) Field of Classification Search .................. None
See application file for complete search history.

(56) References Cited

U.S. PATENT DOCUMENTS

| | | | | |
|---|---|---|---|---|
| 6,327,687 | B1 * | 12/2001 | Rajski et al. | 714/738 |
| 6,557,129 | B1 * | 4/2003 | Rajski et al. | 714/729 |
| 7,353,440 | B2 * | 4/2008 | Ohwada et al. | 714/726 |
| 2004/0237015 | A1 * | 11/2004 | Abdel-Hafez et al. | 714/726 |
| 2005/0268194 | A1 * | 12/2005 | Wang et al. | 714/733 |
| 2007/0234169 | A1 * | 10/2007 | Rajski et al. | 714/742 |
| 2008/0052586 | A1 * | 2/2008 | Rajski et al. | 714/741 |
| 2008/0098267 | A1 * | 4/2008 | Miyake et al. | 714/726 |
| 2008/0256274 | A1 * | 10/2008 | Wohl et al. | 710/68 |
| 2008/0263418 | A1 * | 10/2008 | Ward | 714/724 |
| 2009/0235132 | A1 * | 9/2009 | Wang et al. | 714/726 |

\* cited by examiner

*Primary Examiner*—John P Trimmings
(74) *Attorney, Agent, or Firm*—David D. Brush; Westman, Champlin & Kelly, P.A.

(57) ABSTRACT

A test system tests a circuit. Compressed scan data subsets are stored, one at a time, in a memory of the test system. The multiple compressed scan data subsets correspond with multiple scan chains in a function block of the tested circuit. Transmission of the compressed scan data subset from the memory to the tested circuit is controlled by the test system. The test system receives a compacted test output subset from the tested circuit and provides a test system output that indicates a presence of any errors in functioning of the tested circuit.

11 Claims, 6 Drawing Sheets

TESTING A CIRCUIT WITH COMPRESSED SCAN CHAIN SUBSETS

FIELD OF THE DISCLOSURE

The present disclosure relates generally to testing of circuits, and more particularly but not by limitation to automated testing of application specific integrated circuits.

BACKGROUND OF THE DISCLOSURE

Testing systems that test electrical characteristics of integrated circuits are known. The testing systems typically provide electrical power and a test sequence of user inputs to the integrated circuit for testing. The testing systems also provide scan data to the integrated circuit for testing. The scan data is typically provided to a non-user input (test input) that is used during testing. The scan data presets internal states of the integrated circuit at a start of testing sequence.

Existing testing systems include a limited amount of memory that can be addressed for storing scan data. As the number of function block designs in an integrated circuit increases with increasingly complex integrated circuits, integrated circuit designers have turned to acquisition of selected function block designs from third party vendors of such function block designs. Each of these function block designs includes a set of scan data for the function block. The length of the scan data sequence is typically large. A custom set of scan data is also developed for a custom portion of the integrated circuit. In many cases of complex integrated circuits, the aggregate amount of scan data for a single function block exceeds the size of the limited amount of memory in an existing testing system. Compression of scan data is known. However, even with compression of scan data, the size of the tester memory is exceeded by compressed scan data.

A method and apparatus are needed to enable use of existing integrated circuit testers with integrated circuits that have function blocks with scan data sizes that exceed a memory size of the integrated circuit tester.

SUMMARY

Disclosed are a circuit, a test system and a method for testing the circuit with the test system. The method comprises storing a designated compressed scan data subset, one at a time. The designated compressed scan data subset is selected from multiple compressed scan data subsets. The designated compressed scan data subset is stored in a memory of the test system. The multiple compressed scan data subsets correspond with multiple scan chains in a function block of a tested circuit.

The method comprises controlling transmission of the compressed scan data subset from the memory to the tested circuit. The method comprises receiving a compacted test pattern subset from the tested circuit. The method comprises providing a test system output that indicates a presence or absence of errors in functioning of the tested circuit.

The circuit includes a core with at least one function block connected to perform a user function. The function block includes multiple designated scan chains connected to perform test functions. The circuit receives compressed test scan data subsets that identify designated scan chains and that couple decompressed test scan data subsets to the designated scan chains. The circuit includes a test output circuit that receives uncompacted test output subsets from the designated scan chains and that provides compacted test output subsets to the test environment.

DETAILED DESCRIPTION OF ILLUSTRATIVE EXAMPLES

In one or more of the examples described below, a circuit to be tested includes a core having a user function block connected to perform a user function in a user mode. The function block includes multiple designatable scan chains connected to perform test functions in a test mode. The circuit includes a test input circuit that receives compressed test scan data subsets that identify designated scan chains. The test input circuit couples decompressed test scan data subsets to the designated scan chains. The circuit further includes a test output circuit. The test output circuit receives uncompacted test output subsets from the designated scan chains and provides compacted test output subsets in the test mode.

The circuit to be tested couples to a test system. The test system includes memory that stores a designated one compressed test scan data subset at one time, which is selected from multiple compressed test scan data subsets. The multiple compressed test scan data subsets correspond with multiple scan chains in the function block of the tested circuit. The test system includes a test controller. The test controller designates the designated one compressed scan data subset according to a sequence of designations. The test system controls transmission of the designated compressed test scan data subsets to the tested circuit. The test controller receives compacted test output subsets from the tested circuit. The test controller provides a test system output that indicates presence or absence of errors in functioning of the function block.

Figure 1:
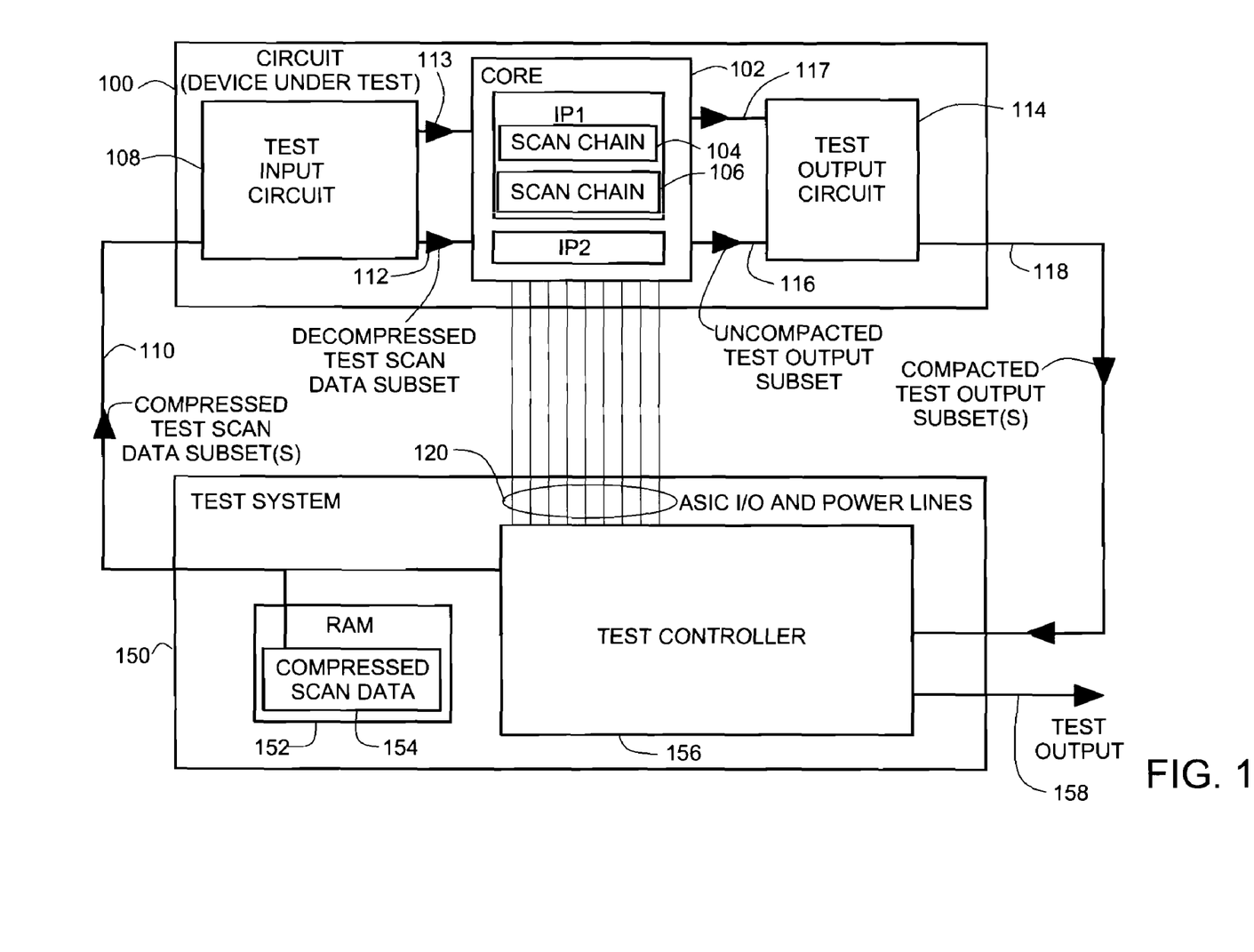
FIG. 1 illustrates a first embodiment of a circuit coupled to a test system.

FIG. 1 illustrates a first embodiment of a circuit 100. The circuit 100 is connected to a test system 150. The test system 150 tests functionality of the circuit 100. According to one aspect, the circuit 100 comprises an application specific integrated circuit (ASIC) and the test system 150 comprises an ASIC tester. The circuit 100 can be tested at a wafer level, a diced level, a wire-bonded level, a packaged level or other known level of integrated circuitry fabrication. The circuit 100 can be fully processed, or it can be tested before final integrated circuit manufacture processes are completed.

The circuit 100 comprises a core 102. The core 102 comprises multiple user function blocks IP1, IP2 that are connected to perform a user function in a user mode. The function block IP1 includes at least two designatable scan chains 104, 106 connected to perform a test function in a test mode provided by the test system 150. Each of the scan chains 104, 106 is smaller than a single scan chain for the function block IP1. The number of scan chains is typically larger than two chains to provide shorter scan chains that require less test system memory. Providing multiple scan chains within a function block permits the circuit 100 to be tested on a test system 150 of limited memory size.

The circuit 100 comprises a test input circuit 108. The test input circuit 108 receives compressed test scan data subsets 110. The test scan data subsets 110 identify designated scan chains 104 or 106 in function block IP1. The test input circuit 108 sequentially couples decompressed test scan data subsets 112, 113 to designated scan chains 104, 106.

The circuit 100 comprises a test output circuit 114. The test output circuit 114 receives uncompacted (also called uncompressed) test output subsets 116, 117 from the designated scan chains 104, 106. The test output circuit 114 provides compacted (also called compressed) test output subsets 118 to the test system 150 which provides a test mode for the circuit 100. Compression (compaction) and expansion (uncompaction, decompression) of subsets can be accomplished using known lossless data compression and data decompression algorithms.

According to one aspect, user power lines, input lines and output lines (collectively designated 120) of the circuit 100 connect to the test system 150. The test system 150 provides power and user inputs to the circuit 100 during test. The test system monitors user outputs of the circuit 100 during test. Depending on the manufacturing level at which the circuit 100 is tested, the lines 120 can comprise wafer probes, chip probes, lead frame connections, sockets or other known electrical test connections to integrated circuits. According to one aspect, the connections are made by an automated test fixture in a production test mode.

According to one aspect, at a beginning of a test using a designated scan chain 106, the decompressed test scan data subset 112 sets an initial internal state within a designated function block IP1. The designated function block IP1 is clocked a fixed number of clock cycles after the initial internal state is set. The uncompacted test output subset 118 represents at least a portion of an end internal state after the designated function block IP1 is clocked during the test. After completion of the test of scan chain 106, testing continues to test the scan chain 104 in function block IP1.

The test system 150 comprises a memory 152. The memory 152 stores a compressed test scan data subset 154 (that is currently the designated one), selected from multiple compressed test scan data subsets. The memory stores one compressed test scan data subset at a time, and multiple compressed scan data subsets are sequentially placed in memory. The multiple compressed test scan data subsets correspond with multiple scan chains 104, 106 in multiple user function blocks IP1 of the circuit 100 that is being tested. According to one aspect, the memory 152 has a limited storage capacity that is less than an aggregate of the sizes of the compressed scan data subsets, but at least as large as the largest scan data subset.

According to one aspect, when multiple selected compressed scan chains are all so short that they can be loaded in memory 152 simultaneously, then the multiple selected short scan chains are simultaneously present in the memory 152.

The test system 150 comprises a test controller 156. The test controller 156 designates the designated one compressed scan data subset 154 according to a sequence of designations. The test controller 156 controls transmission of the designated one compressed test scan data subset 154 to the tested circuit 100. The test controller 156 receives the compacted test output subset 118 from the tested circuit 100. The test controller 156 provides a test system output 158. The test system output 158. Any deviation in the logic states of the compacted test output subsets 118 from an expected test output may indicate error.

The circuit 100 and the test system 150 are explained in more detail below by way of examples illustrated in FIGS. 2-3. Reference numbers used in FIGS. 2-3 that are the same as reference numbers used in FIG. 1 designate the same or similar features. For the sake of brevity, descriptions of such features are not repeated in connection with FIGS. 2-3.

Figure 2:
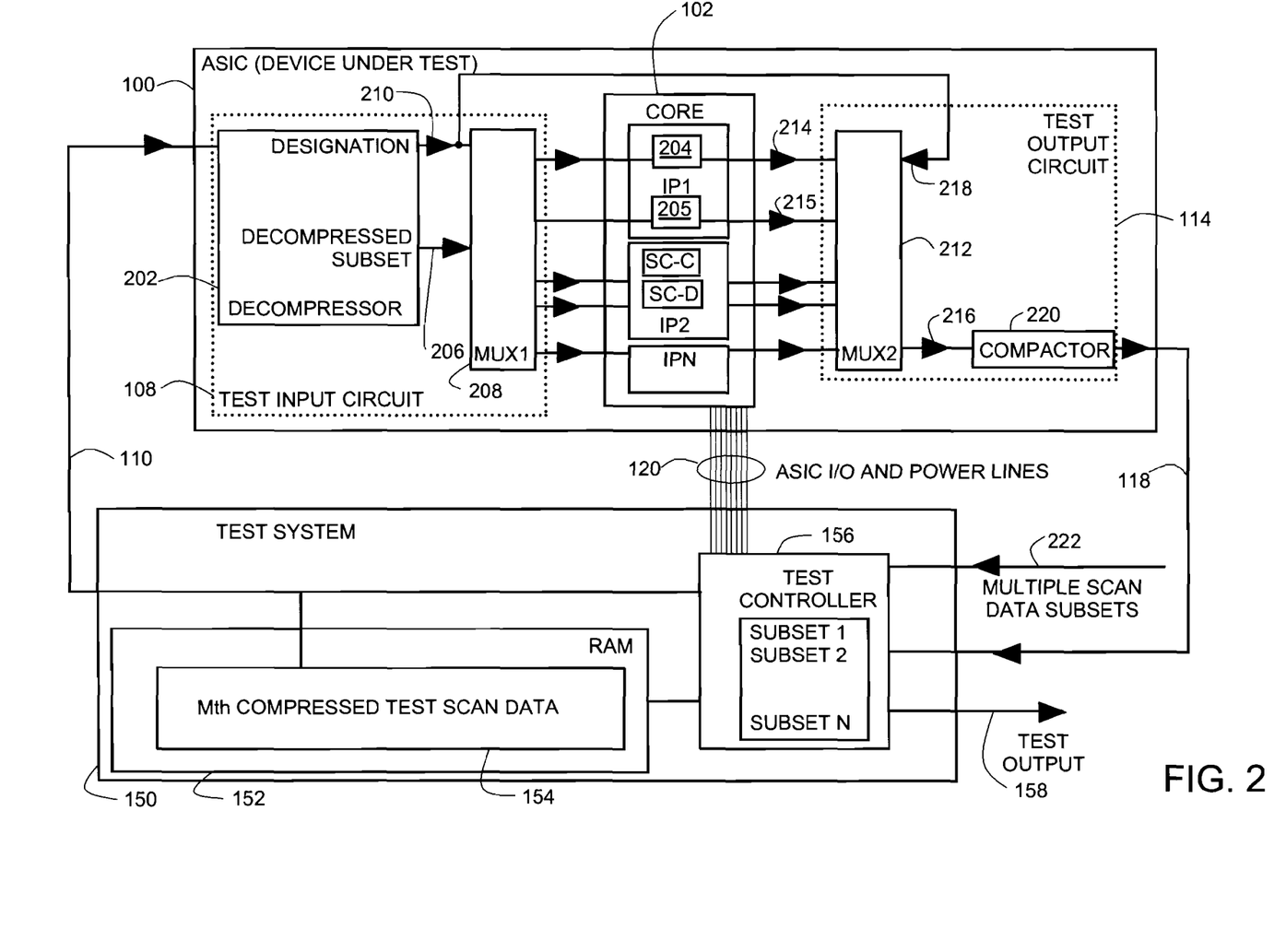
FIG. 2 illustrates a second embodiment of a circuit coupled to a test system.

In FIG. 2, a test input circuit 108 comprises a decompressor 202. The decompressor 202 receives compressed test scan data subsets 110. The compressed test scan data subsets 110 identify designated scan chains (such as scan chain 204, 205 for example). The decompressor 202 generates decompressed test scan data subsets 206 for the designated chain 204.

In FIG. 2, the test input circuit 108 comprises a test scan data multiplexer 208. The test scan data multiplexer 208 couples the decompressed test scan data subsets 206 to the designated scan chains 204, 205. The decompressor 202 provides a designation output 210 that couples to a select input of the test scan data multiplexer 208. According to one aspect, the multiplexer 208 comprises a 1-to-N line multiplexer circuit.

In FIG. 2, the test output circuit 114 comprises a test output multiplexer 212. The test output multiplexer 212 receives uncompressed test output subsets 214, 215 from the designated scan chains 204, 205 of the function block IP1. The test output multiplexer 212 sequentially provides the designated uncompressed test output subset 214, 215 at a multiplexer output 216. The test output multiplexer 212 receives the designation output 210 at a select input 218. According to one aspect, the multiplexer 212 comprises an N-to-1 line multiplexer circuit. The test output circuit 114 comprises a compactor 220. The compactor 220 sequentially receives the designated test output subsets 214, 215 from the multiplexer output 216. The compactor 220 provides compacted test output subsets 118 in the test mode.

In FIG. 2, the test input circuit 108 receives a sequence of multiple compressed test scan data subsets (SUBSETS 1, 2, . . . , N). The test output circuit 114 provides a sequence of compacted test output subsets 118 in the test mode according to a sequence of designations that is included in the compressed test scan data subsets 110. The test controller 156 sequential stores individual compressed scan test data subsets 154, one at a time, in memory 152. According to one aspect, the memory 152 comprises random access memory (RAM) and has a size that does not permit simultaneous storage of multiple scan test data subsets 154. As illustrated in FIG. 2, multiple function blocks IP1, IP2 can each comprise multiple scan chains.

In FIG. 2, test scan data subsets and other test parameters are provided to the test controller 156 from a test controller input 222.

Figure 3:
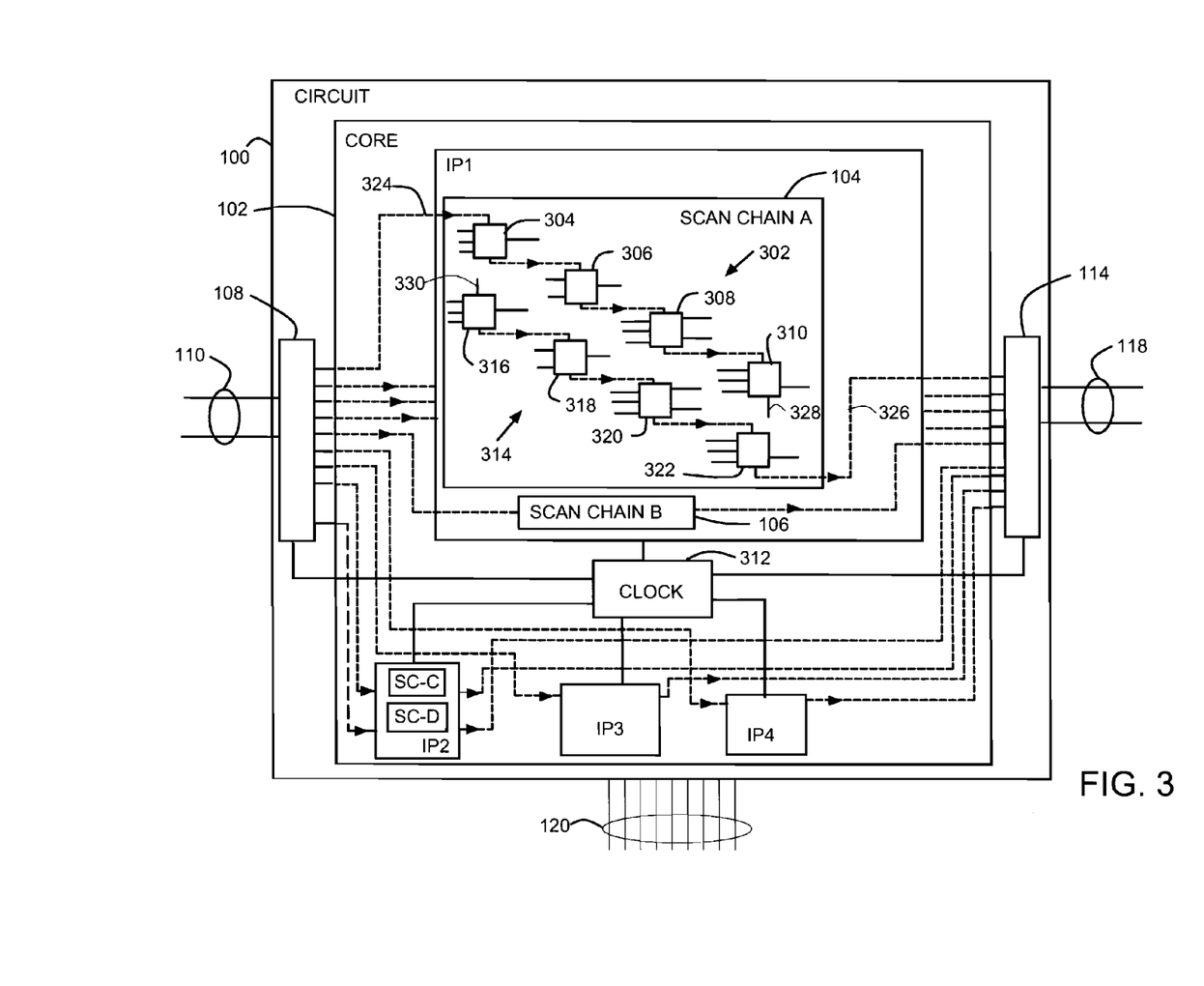
FIG. 3 illustrates a third embodiment of a circuit coupled to a test system.

FIG. 3 illustrates an example of a scan chain 104 in a function block IP1, 20 which comprises at least one shift register 302. The shift register 302 comprises registers 304, 306, 308, 310. The registers 304, 306, 308, 310 shift data serially from one register to the next along dashed lines shown at the top and bottom of registers 304, 306, 308, 310. In a test mode, serial shifting of data in shift register 302 is clocked by a clock 312 that is included in the core 102. The registers 304, 306, 308, 310 have user inputs illustrated at a left side of each register. The registers 304, 306, 308 have user outputs that are illustrated on a right side of each register. The user inputs and outputs are used in the user application mode and are also used in the test mode. According to one aspect, shift register 302 comprises a serial shift register input 324 which functions as a test input and the registers 304, 306, 308, 310 each comprise a memory element. The data that is serially shifted into the shift register 302 comprises a decompressed test scan data subset. When the data is fully shifted in to the shift register 302, the decompressed test scan data subset sets an initial internal state within the function block IP1. A register is a memory element that stores one or more bits.

In the example shown in FIG. 3, scan chain 104 further comprises a shift register 314. The shift register 314 comprises registers 316, 318, 320, 322. Similar to shift register 302, the registers 316, 318, 320, 322 shift data serially from one register to the next along dashed lines shown at the top and bottom of registers 316, 318, 320, 322. In a test mode, serial shifting of data in shift register 314 is clocked by the clock 312. The registers 316, 318, 320, 322 have user inputs illustrated at a left side of each register. The registers 316, 318, 320, 322 have user outputs that are illustrated on a right side of each register. The user inputs and outputs are used in the user application mode and are also used in the test mode. According to one aspect, shift register 314 comprises a serial shift register output 326 that functions as a test output and the registers 316, 318, 320, 322 each comprise a memory element. The data that is serially shifted out of the shift register 314 comprises an uncompressed test output subset. When the data is fully shifted out of the shift register 314, the uncompressed test output subset represents an end internal state within the function block IP1.

According to one aspect, shift registers 302, 314 can be two separate shift registers as illustrated in FIG. 3. According to another aspect, shift registers 302, 314 can be two parts of the same overall shift register. For example, shift register output 328 can be connected to shift register input 330 to form a single shift register in the scan chain 104. When shift registers 302, 304 are part of the same overall shift register, data is shifted from the register 310 to register 316 and the combined shift register comprises a serial in, serial out shift register.

The function block IP1 comprises a first scan chain 104 (scan chain A) and a second scan chain B as illustrated.

Multiple scan chains are provided in order that individual scan chains are shorter or have fewer series connected registers. The illustration in FIG. 3 is merely illustrative, and larger number of registers can be included in each scan chain, and larger numbers of scan chains can be included in a function block, or in multiple function blocks.

With increasing circuit design sizes in nanometer scale technologies of integrated circuits, scan data volume continues to grow at a tremendous rate. As increasing numbers of fault/defect models (e.g., Stuck-at, Transition delay, Path delay, Bridging etc.) are used, test data volume needed to achieve desired DPPM (defective parts per million) continues to grow significantly. There are some design styles that typically require larger numbers of scan vectors, causing varied data volume across designs of same size in terms of gate count. The test industry has provided various scan compression techniques to reduce the scan data volume and test application time. But prediction of required compression (to fit into the available scan memory on the target tester) becomes a challenge and targets highest possible compression. Not achieving the required compression may increase the test cost by forcing the design to use expensive testers (with large scan memory) or multiple tester loads.

Figure 4:
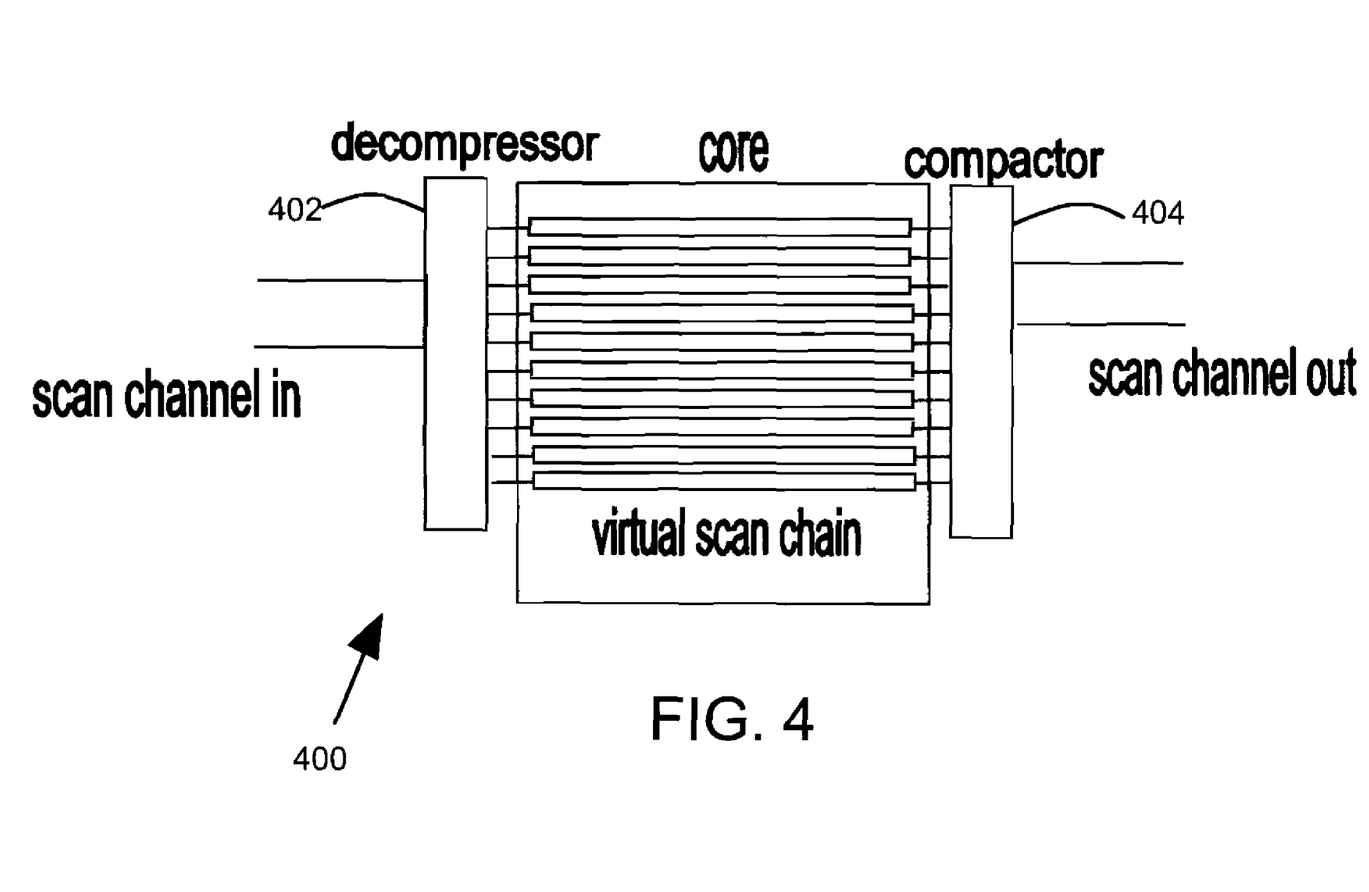
FIG. 4 illustrates compression of test data.

TestKompress compression technology available from Mentor Graphics Corporation, Wilsonville, Oreg. USA is based on a deterministic technology development tool (EDT) and achieves test data volume and test time compression up to 100×. Such compression technology, illustrated at 400 in FIG. 4, requires minimal area overhead for a decompressor 402 and a compactor 404. Maximum compression ratio is defined by chain/channel ratio. The embodiments illustrated in FIGS. 1-3 are adaptable for use in conjunction with EDT compression technology such as that illustrated in FIG. 4. In the circuit 400, however, large scan memory in a test system is frequently needed, and smaller test systems with smaller scan memory size may not be practical.

Maximum achievable compression is limited by the length of the longest scan chain. Time-to-market and higher levels of system-on-chip (SoC) integration are resulting in the design of circuits using several IP blocks that are either internally developed or acquired from 3rd party vendors. These IP blocks often come in the form of hard IP such that the design cannot be changed. The maximum achievable compression is often limited by the length of the longest scan chain in the hard IP blocks. Such hard IP block designs can include so called "Don't care" (X) state generation, which reduce the effective compression.

A common problem limiting the effective compression is due to X generation (generation of "don't care" logic states) in a design. Some scan compression techniques handle X's better than others. This comes at the expense of more number of test vectors thereby reducing the effective compression. In some of the designs, pattern count increases up to 50%. Data for two different ASIC designs are shown in Table 1. Table 1 shows effective compression efficiency of about 65% of the target compression ratio.

TABLE 1

| # of Scan Channels | Target Compression Ratio | Max Chain Length in Test-Kompress Mode | #of Patterns in Test-Kompress, SAF | Chain Length (Bypass) | # of Patterns Bypass | Effective Compression |
|---|---|---|---|---|---|---|
| 32 | 10 | 1007 | 3811 | 10051 | 2472 | 6.47 |
| 32 | 10 | 394 | 3931 | 3931 | 6130 | 6.56 |

In Table 1, increased pattern count and not maximum chain length explains the lower compression ratio. Test Coverage improved marginally or remained same, demonstrating that these are not the reasons for achieving lower compression. Another possible component impacting compression is the encoding capability of decompressor. When output side compression (i.e., the compactor) is turned off to find out loss of compression efficiency due to encoding of decompressor, the results of effective compression efficiency of about 95% of target compression ratio (10) are as shown in Table 2. The compression efficiency with the decompressor turned off is higher than with the decompressor turned on.

TABLE 2

| # of Patterns (Bypass) | # of Patterns (Compactor OFF) | Effective Compression |
|---|---|---|
| 2472 | 2582 | 9.5 |

Analysis shows that the root cause for the loss of efficiency in compression is due to the loss of coverage while the compactor is handling X ("don't care) values generated in the design. To compensate for the loss of coverage additional test patterns are required.

As the compression ratio increases, compression efficiency goes down at a higher percentage and the challenge is in identifying the target compression to get desired reduction in scan data volume. Table 3 shows the data for an ASIC for different target compression ratios using 32 scan channels.

TABLE 3

| Target Compression Ratio | Scan Chain Length | | Pattern Count | | Effective Compression | Compression Efficiency |
|---|---|---|---|---|---|---|
| | Bypass SAF | Test-Kompress SAF | Bypass SAF | Test-Kompress SAF | | |
| 12 | 19451 | 1663 | 10444 | 12231 | 9.99 | 83.25 |
| 20 | 19738 | 997 | 10460 | 12813 | 16.16 | 80.80 |
| 38 | 19201 | 525 | 10472 | 13526 | 28.32 | 74.52 |
| 58 | 19201 | 330 | 10472 | 15538 | 39.67 | 68.40 |

The sources of X values are very design dependent and identifying and fixing them requires a detailed analysis of the design and it can be a time-consuming and expensive task.

Another bottleneck in achieving the target compression is the length of longest scan chain in the hard IPs. In nanometer technologies, to get better time-to-market several hard IPs are used that may be internally generated or licensed from a 3rd party vendor. This means that the scan chain length of hard IPs can be long. The data presented in Table 4 below shows that the maximum compression one can achieve on a design is often limited by length of longest scan chain in hard IP. To keep low test cost for this ASIC, the target tester had a maximum of 512 MB of scan memory that can support up-to 32 scan channels.

Mentor TestKompress was used to implement the target compression and used single EDT IP that controls all the internal scan chains.

TABLE 4

| | |
|---|---|
| Total Scan Channels | 32 |
| # of Flops (total) | 361248 |
| Longest IP Chain Length | 296 |
| Max Possible Compression (# of Chains, Channels) | 39X (1248, 32) |
| SAF Scan Data Volume (MB) | 182.08 |
| TDF Scan Data Volume (MB) | 716.25 |
| Total Scan Volume (SAF + TDF)(MB) | 898.33 |

As shown in Table 4, to test the ASIC on a tester in a single load, patterns have to be truncated from 898 MB down to 512 MB. This option is not desirable since it results in reduced quality and higher DPPM. Higher compression could have been achieved if hard IP scan chains were shorter than what is shown in the table above.

Solutions for addressing compression limited by long IP scan chain length are disclosed in connection with embodiments shown in FIGS. 1-3.

To handle scan chain length limitation of hard IP, a test was performed using Mentor Graphics TestKompress. The ASIC of Table 4 was used which had a hard IP.

Figure 5:
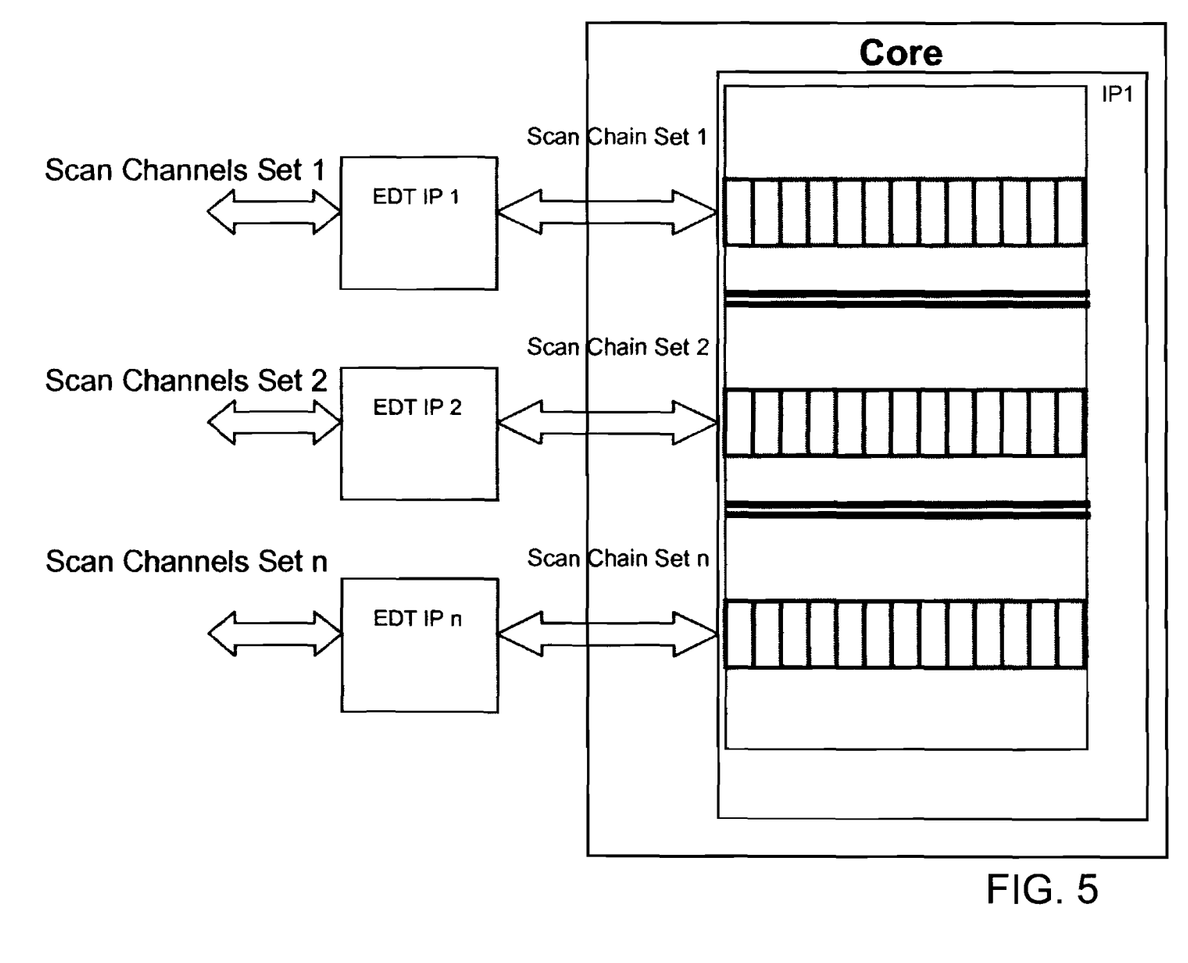
FIG. 5 illustrates virtual test scan chains.

As illustrated in FIG. 5, one approach using multiple EDT IP (EDT IP 1, EDT IP 2, EDT IP 3) was tried. Appropriate numbers of scan channels were distributed for each EDT IP and a modified ATPG process was used. FIG. 5 shows an abstraction of multiple EDT approach.

Another approach was tested on the ASIC of Table 4 with 2 EDT IP. Projected scan volume for this ASIC (stuck-at-faults (SAF) and transition-delay-faults (TDF)) was reduced from 898 MB to 730 MB. This change allows testing to go forward on a tester with at least 730 MB available scan memory, In other applications, scan memory can be reduced so that testers with scan memories as small as 512 MB can be used. The results demonstrate that it is possible to increase the effective compression by use of multiple EDT IP rather than having a long scan chain in a function block. Not achieving the desired compression may increase the test cost by forcing the design to use an expensive tester (with large scan memory) or multiple tester loads.

Figure 6:
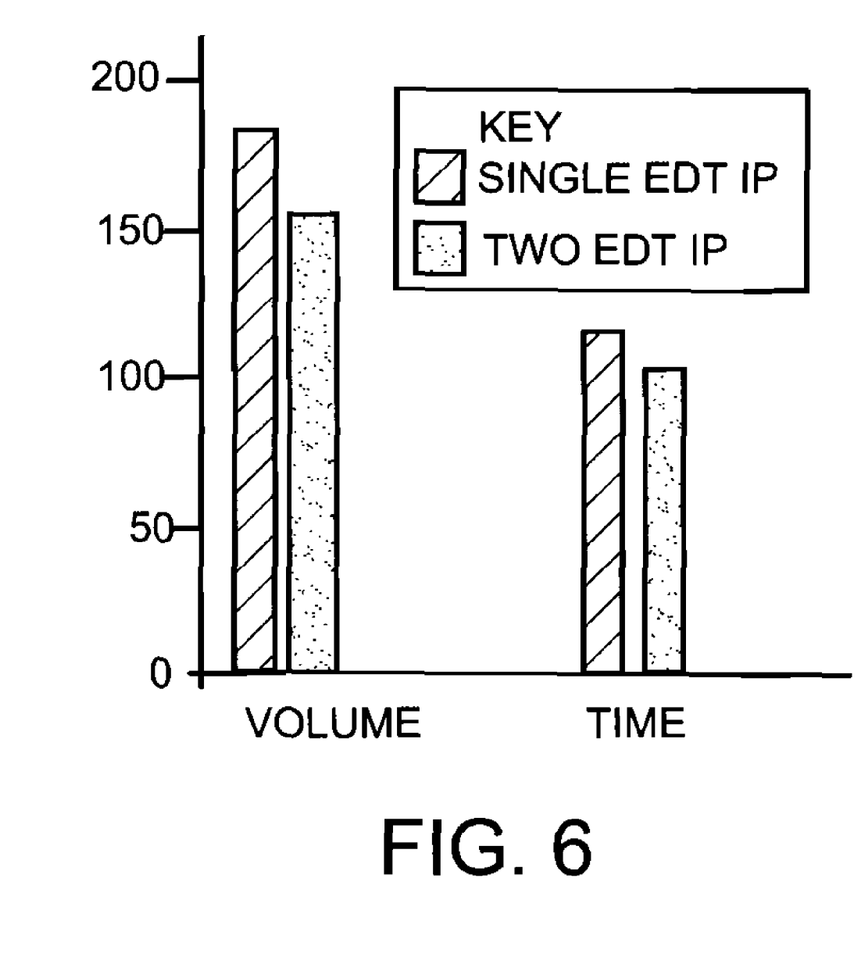
FIG. 6 illustrates a graph of performance with and without multiple scan chains in a function block of a circuit.

Without changing the IP and minimal design changes to provide multiple shorter scan chains in a function block, reduction in scan volume is achieved. Another possible reduction is in power required to do scan test. Since the core part of logic or customer part of logic is inactive or not clocked, power during scan test can be reduced. Results of the change from single EDT IP to two EDT IP are illustrated in the bar chart in FIG. 6. As can be seen from FIG. 6, the test scan volume and test time both decrease with the use of multiple EDT IP.

Although the disclosure has been presented with reference to illustrative examples, workers skilled in the art will recognize that changes may be made in form and detail without departing from the scope of the disclosure.

What is claimed is:

1. A test system, comprising:
    memory that stores one designated compressed test scan data subset at a time selected from multiple compressed test scan data subsets, the multiple compressed test scan data subsets corresponding with multiple scan chains in a function block of a tested circuit;
    a test controller that designates the designated compressed scan data subset according to a sequence of designations and that controls transmission of the designated compressed test scan data subsets to the tested circuit, the test controller receiving compacted test output subsets from the tested circuit and providing a test system output that indicates errors in functioning of the function block; and
    connections on the test system for connecting the test controller to user input lines, user output lines and power lines of the tested circuit.

2. The test system of claim 1 wherein the test controller controls sequential transmission of the multiple compressed scan data subsets to the tested circuit for sequentially testing multiple function blocks.

3. The test system of claim 1 wherein the memory has a storage capacity that is less than an aggregate of the sizes of the compressed scan data subsets, but at least as large as the largest of the compressed scan data subsets.

4. The test system of claim 1 wherein:

the test system sets an initial internal state within the function block in the tested circuit;

the test system controls clocking of a designated scan chain for a selected number of clock cycles after the initial internal state is set; and the test system receives a compacted test output subset that represents at least a portion of an end internal state after the designated scan chain is clocked.

5. A method for a test system, comprising:

storing a designated compressed scan data subset, one at a time, selected from multiple compressed scan data subsets, in a memory of the test system, the multiple compressed scan data subsets corresponding with multiple scan chains in a function block of a tested circuit;

controlling transmission of the designated compressed scan data subset from the memory to the tested circuit; and receiving a compacted test output subset from the tested circuit and providing a test system output that indicates a presence of errors in functioning of the tested circuit; and connecting user input lines, user output lines and power lines of the tested circuit to a test controller of the test system.

6. The method of claim 5 wherein the multiple compressed scan data subsets are sequentially designated for storage in the memory and are sequentially transmitted to the multiple scan chains in the function block.

7. The method of claim 5 wherein:

the test system sets an initial internal state within a designated scan chain in the tested circuit;

the test system controls clocking of the designated scan chain for a selected number of clock cycles after the initial internal state is set; and the compacted test output subset represents at least a portion of an end internal state after the designated scan chain is clocked.

8. The method of claim 7 wherein user inputs of the tested circuit set the initial internal state of the tested circuit.

9. The method of claim 7 wherein user outputs of the tested circuit represent at least a portion of an end internal state of the tested circuit.

10. The method of claim 5 wherein a clock in the core clocks the scan chain.

11. A test system, comprising:

memory that stores one designated compressed test scan data subset at a time selected from multiple compressed test scan data subsets, the multiple compressed test scan data subsets corresponding with multiple scan chains in a function block of a tested circuit;

a test controller that designates the designated compressed test scan data subset according to a sequence of designations and that controls transmission of the designated compressed test scan data subsets to the tested circuit, the test controller receiving compacted test output subsets from the tested circuit and providing a test system output that indicates errors in functioning of the function block; and wherein the memory has a storage capacity that is less than an aggregate of the sizes of the compressed test scan data subsets, but at least as large as the largest of the compressed test scan data subsets.

* * * * *